(12) United States Patent
May et al.

(10) Patent No.: US 9,041,452 B2
(45) Date of Patent: May 26, 2015

(54) CIRCUIT AND METHOD OF CLOCKING MULTIPLE DIGITAL CIRCUITS IN MULTIPLE PHASES

(75) Inventors: Michael Robert May, Austin, TX (US); David S. Trager, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 730 days.

(21) Appl. No.: 12/694,630

(22) Filed: Jan. 27, 2010

(65) Prior Publication Data

US 2011/0181325 A1 Jul. 28, 2011

(51) Int. Cl.
*H03K 3/00* (2006.01)
*G06F 1/06* (2006.01)
*H03K 3/84* (2006.01)
*G06F 1/10* (2006.01)

(52) U.S. Cl.
CPC ... *G06F 1/06* (2013.01); *G06F 1/10* (2013.01); *H03K 3/84* (2013.01)

(58) Field of Classification Search
USPC .................................. 327/291–296, 298, 299
See application file for complete search history.

(56) References Cited

U.S. PATENT DOCUMENTS

| | | |
|---|---|---|
| 3,941,989 A | 3/1976 | McLaughlin et al. |
| 4,164,666 A | 8/1979 | Hirasawa |
| 4,962,512 A | 10/1990 | Kiuchi |
| 4,996,454 A | 2/1991 | Peczalski et al. |
| 5,120,990 A | 6/1992 | Koker |
| 5,133,064 A | 7/1992 | Hotta et al. |
| 5,394,443 A | 2/1995 | Byers et al. |
| 5,517,147 A | 5/1996 | Burroughs et al. |
| 5,614,868 A | 3/1997 | Nielson |
| 5,675,263 A | 10/1997 | Gabara |
| 5,731,728 A | 3/1998 | Greiss |
| 5,963,068 A | 10/1999 | Hardesty et al. |
| 6,111,448 A | 8/2000 | Shibayama |
| 6,753,712 B2 * | 6/2004 | Saeki ............................ 327/165 |
| 6,768,361 B2 | 7/2004 | Kwak |
| 6,794,912 B2 | 9/2004 | Hirata et al. |
| 6,987,825 B1 * | 1/2006 | Yoshimura et al. ........... 375/371 |
| 7,218,562 B2 * | 5/2007 | Campbell ..................... 365/203 |
| 7,252,238 B2 * | 8/2007 | Wilz et al. ................ 235/462.43 |
| 7,323,921 B2 | 1/2008 | Lowe et al. |
| 7,391,347 B2 | 6/2008 | May et al. |
| 7,471,134 B2 | 12/2008 | Dornbusch |
| 7,620,131 B2 | 11/2009 | May et al. |
| 7,786,786 B2 * | 8/2010 | Kirichenko ................... 327/295 |
| 8,023,608 B2 * | 9/2011 | Jang .............................. 375/376 |
| 8,539,407 B2 * | 9/2013 | Dirks et al. ................... 716/108 |
| 2001/0015639 A1 | 8/2001 | Aas et al. |

(Continued)

*Primary Examiner* — Sibin Chen
(74) *Attorney, Agent, or Firm* — Cesari & Reed LLP; R. Michael Reed

(57) ABSTRACT

A circuit includes a power supply terminal and a clock parsing circuit configured to produce multiple clock signals having a common clock period and different phases. The circuit further includes a plurality of digital circuits coupled to the clock parsing circuit and the power supply terminal. Each digital circuit includes an input to receive data and logic to process the data. Each digital circuit is responsive to a phase associated with a respective clock signal of the multiple clock signals to draw current from the regulated power supply terminal to process the data to produce a data output. Additionally, the circuit includes an output timing management circuit coupled to each of the plurality of digital circuits and configured to control data outputs of each of plurality of digital circuits to prevent timing violations at one or more destination circuits.

25 Claims, 5 Drawing Sheets

(56) References Cited

U.S. PATENT DOCUMENTS

| | | | |
|---|---|---|---|
| 2005/0135527 A1* | 6/2005 | Masui et al. | 375/355 |
| 2007/0200641 A1 | 8/2007 | Sen et al. | |
| 2008/0174347 A1* | 7/2008 | Oshima | 327/145 |
| 2008/0256382 A1 | 10/2008 | Jacobowitz et al. | |
| 2009/0009228 A1 | 1/2009 | Jang et al. | |
| 2009/0045882 A1 | 2/2009 | Kim et al. | |
| 2009/0265498 A1 | 10/2009 | Yamaoka | |

\* cited by examiner

US 9,041,452 B2

CIRCUIT AND METHOD OF CLOCKING MULTIPLE DIGITAL CIRCUITS IN MULTIPLE PHASES

FIELD

The present disclosure is generally related to a circuit and method of clocking multiple digital circuits in multiple phases.

BACKGROUND

As digital circuitry operates, the circuitry generates impulses of current drawn from a regulated power supply ($V_{dd}$). In general, digital circuitry performs a task or operation with each clock cycle, and the task or operation is completed by the digital circuitry before the next clock edge is received. Accordingly, when a digital circuit is actively processing data, the current drawn by the digital circuit tends to vary periodically with the clock signal. Such variations can appear as pulses or transient variations in the power supply current or can produce transient decreases in the power supply voltage. Assuming that the current drawn by the digital circuit follows a periodic pattern, such as pulses of a clock signal, the current drawn by the digital circuit can introduce a sawtooth waveform on the power supply current.

Some of the energy from such current variations can reach a power supply input pin of the circuit (due to finite reverse power supply rejection ratio (RPSRR)). Such energy at the power supply input pin can radiate spectral energy, producing radio frequency interference that can interfere with nearby receiver circuitry.

Conventionally, circuitry has been implemented to control the power supply circuitry to produce a power supply current having reduced AC components. In one example, power supply regulators are designed so that variations in the load current from the digital circuitry are only minimally coupled back to current variations at the power supply input pin and to the supply current flowing external to the integrated circuit. While such regulators reduce external supply current variations, the digital load current may still vary.

DETAILED DESCRIPTION OF ILLUSTRATIVE EMBODIMENTS

Figure 1:
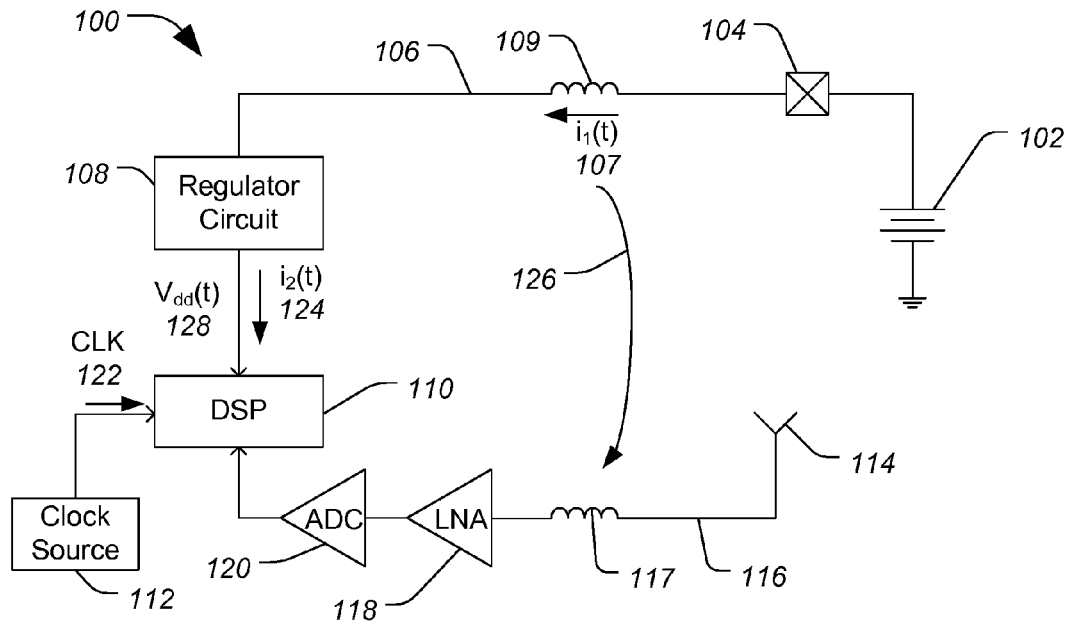
FIG. 1 is a partial block and partial schematic diagram of a conventional circuit including digital circuitry having a variable current draw.

FIG. 1 is a partial block and partial schematic diagram of a conventional circuit 100 including digital circuitry 110 that has a variable current draw. Circuit 100 includes a pin 104 connected to a power source 102. Pin 104 can be a conductive lead, and bond pad or other conductive input configurable to connect to power source 102. The power source 102 can be a battery or another circuit, depending on the implementation.

Circuit 100 includes a regulator circuit 108 connected by a wire trace 106 to the pin 104. Wire trace 106 includes a parasitic inductance, represented by inductor 109. Regulator circuit 108 is connected to a digital signal processor (DSP) 110, which is connected to a clock source 112 to receive a clock signal (CLK) 122.

Circuit 100 also includes a low noise amplifier (LNA) 118 including an input connected to an antenna 114 through a wire trace 116, which has a parasitic inductance represented by inductor 117. LNA 118 includes an output connected to an input of an analog-to-digital converter (ADC) 120, which includes an output connected to DSP 110.

During operation, regulator circuit 108 draws current $i_1(t)$ from power supply 102 and produces a regulated voltage $V_{dd}(t)$ 128. DSP 110 draws current from regulated voltage $V_{dd}(t)$ 128 when necessary to process data. At times, DSP 110 may enter an idle state and draw a nominal current. When in full operation, such as when processing data from ADC 120 that is related to radio frequency content received by antenna 114, DSP 110 draws additional current. In particular, DSP 110 processes data according to input clock signal 122, drawing current for each operation in conjunction with the period of input clock signal 122. Thus, as DSP 110 processes the data, its current draw $i_2(t)$ 124 varies periodically with input clock signal 122, producing current impulses from the supply voltage $V_{dd}(t)$ 128. Depending on the reverse power supply rejection ratio of regulator circuit 108, such variations in the current $i_2(t)$ 124 can introduce periodic current spikes on the power supply current $i_1(t)$ 107.

Figure 2:
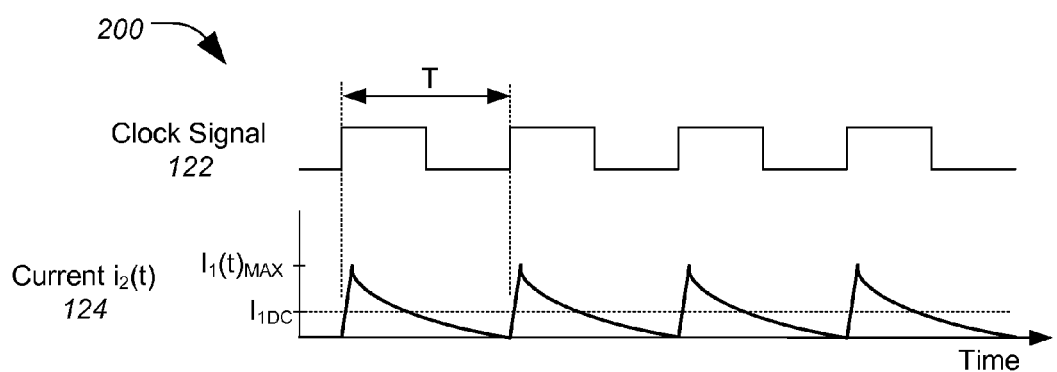
FIG. 2 is a representative example of a timing diagram depicting current variation due to variable current drawn by the digital circuitry in the conventional circuit of FIG. 1.

FIG. 2 is a representative example of a timing diagram 200 depicting current variation due to variable current drawn by the digital circuitry in the conventional circuit 100 of FIG. 1. Input clock signal 122 has a clock period (T). The current $i_2(t)$ 124 represents a current profile of circuit 100. The DC current ($I_{1DC}$) represents a DC current required by circuit 100 to operate.

When processing data, DSP 110 draws current periodically with input clock signal 122, causing periodic variations in current $i_2(t)$ 124. The AC current swings from a maximum current ($I_{max}$) to approximately zero in conjunction with the period of input clock signal 122, since the current consumption returns to zero before the next clock pulse to avoid timing violations within DSP 110. As represented in timing diagram 200, since DSP 110 begins each data operation at the beginning of each clock period and completes each data operation before the beginning of a next clock period, the current $i_2(t)$ 124 rises, peaks, and then decreases within each clock period (T) of input clock signal 122. Some of the energy from the current variation will feed back to the pin 104 due to finite reverse power supply rejection ratio of regulator circuit 108. Such variation produces radiated spectral energy that can be inductively coupled to wire trace 116 (as indicated by arrow 126 depicted in FIG. 1), causing radio frequency interference with the receiver circuitry (including antenna 114, LNA 118, and ADC 120). In particular, the AC current is problematic for radio frequency interference, since large current transients induce significant voltages in other circuits.

Voltage regulator 108 is generally not configured to source AC current sufficient to satisfy the AC current variations caused by DSP 110. Thus, voltage regulator 108 draws more current from power supply 102, and the variations in the current $i_2(t)$ 124 drawn by DSP 110 impact power supply current $i_1(t)$ 107.

Many integrated circuits, including system-on-a-chip (SOC) integrated circuits, include one or more circuit modules that are particularly susceptible to noise within certain frequency bands. For instance, a super heterodyne radio receiver may be susceptible to noise and spurs caused by such circuit modules that can radiate at frequencies within a pass band of the radio frequency input or an intermediate frequency filter. While a certain amount of noise in a circuit is inevitable, the placement of noise signals, including spurs and harmonics, at frequencies that are outside the frequency bands occupied by desirable signals can enhance overall performance of the circuit.

Rising and falling clock edges can produce noise transients due to parasitic inductance and capacitance present in circuit implementations. The use of a common clock signal over multiple circuit modules can create a potential additive effect caused by the simultaneous or near simultaneous generation of noise transients at multiple circuit modules.

Figure 3:
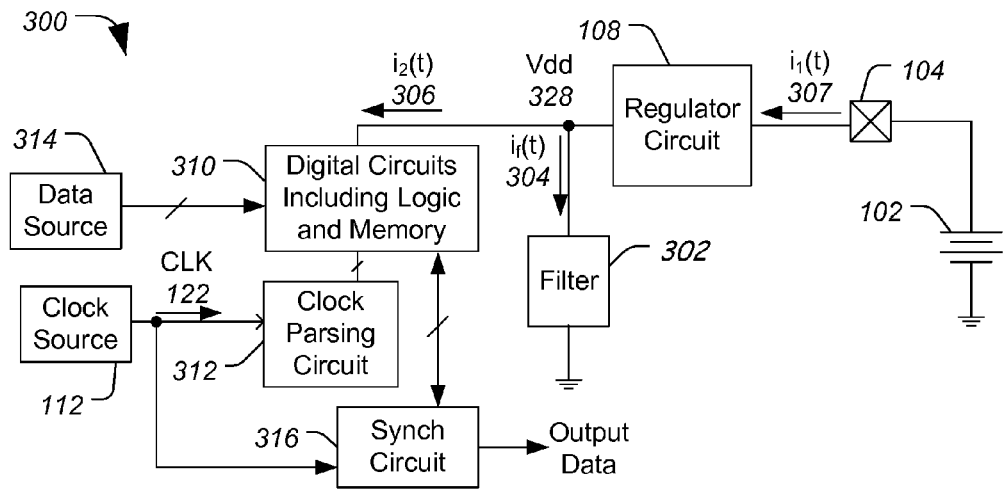
FIG. 3 is a partial block and partial schematic diagram of an embodiment of a circuit including a clock parsing circuit to clock multiple digital circuits in multiple phases.

A circuit is disclosed below that includes a clock parsing circuit configured to produce multiple output clock signals having different phases and a common output clock period. The clock parsing circuit uses the multiple clock signals to drive (clock) multiple digital circuits in different phases. Each digital circuit includes a data input to receive data and logic to process the data according to one of the multiple output clock signals. By clocking the digital circuits using the different phases, the current drawn by the digital circuits to process the data is distributed across the clock period according to the different phases, reducing the total instantaneous AC current and smoothing the AC current drawn by the multiple digital circuits. Remaining AC current spikes are at higher frequencies where they can be more easily filtered. Further, distributing the timing of the current draw reduces the peak-to-peak variations in the current, as compared to the circuit 100 depicted in FIG. 1, making it possible to readily filter the remaining variations using an on-chip filter, such as a capacitor. FIG. 3 represents one example of a circuit configured to clock multiple digital circuits using clock signals having different phases.

FIG. 3 is a partial block and partial schematic diagram of an embodiment of a circuit 300 including a clock parsing circuit 312 to drive (clock) multiple digital circuits 310 in multiple phases. Circuit 300 includes a filter 302 connected to the output of regulator circuit 108. Circuit 300 further includes digital circuits 310 connected to voltage regulator 108. Each of the digital circuits 310 includes a data input to receive data and multiple logic circuits to process the data to produce output data, and data storage elements to store the data and/or the output data. Such logic circuits can include an arithmetic logic unit (ALU), an adder unit, a multiply-add unit, other logical or arithmetic circuitry, or any combination thereof. Data storage elements include flip-flops, registers, buffers, cache memory, other data storage elements, or any combination thereof.

Digital circuits 310 can include digital circuitry, such as a digital signal processor (DSP), a central processing unit (CPU), digital logic, other circuitry, or any combination thereof. Circuit 300 also includes clock parsing circuit 312, which is connected to clock source 112 to receive input clock signal 122 and which is connected to digital circuits 310. Digital circuits 310 are connected to data source 314 to receive data. Data source 314 can be an analog-to-digital converter (ADC), such as ADC 120 in FIG. 1, a memory, or another digital circuit. Digital circuits 310 are also connected to a synchronization circuit 316. Synchronization circuit 316 is configured to synchronize output data received from each of the digital circuits 310 to a clock signal, such as input clock signal 122.

During operation, regulator circuit 108 draws a power supply current $i_1(t)$ 307 from power supply 102 and produces a regulated power supply voltage 328, labeled $V_{dd}$, from which digital circuits 310 draw current $i_2(t)$ 306. Clock parsing circuit 312 receives input clock signal 122 and generates multiple output clock signals having different phases and having the same period as input clock signal 122. Clock parsing circuit 312 clocks digital circuits 310 in multiple phases using the multiple output clock signals. Each digital circuit 310 receives data from data source 314 and draws current to process the data to produce output data according to a unique one of the multiple output clock signals, such that the currents drawn by the digital circuits 310 are staggered across an output clock period. Synchronization circuit 316 receives the output data from each of the digital circuits 310 and input clock signal 122 and synchronizes the output data to produce one or more output data signals that are synchronized to the input clock signal 122. In an alternative embodiment, the synchronization circuit 316 is configurable to synchronize the output data using a second clock signal (not shown) or to one of the multiple output clock signals. Also, other embodiments could have a data source that is coming from inside the digital circuit 310. For example, data from circuitry driven by one phase of the clock could be outputted and further processed by circuitry driven by a second phase of the clock.

By driving digital circuits 310 in different phases, a fraction of the digital circuits 310 is clocked at any given phase of the output clock signal, distributing the current demand across the output clock period. Thus, the individual AC currents from each of the digital circuits 310 are less than the total AC current and they add together to produce current $i_2(t)$ 306. Since each of the digital circuits 310 draws its current in connection with its unique one of the multiple output clock signals, each of the multiple digital circuits 310 draws current at a different phase within the output clock period independent of the other digital circuits 310, the total instantaneous AC current drawn by the multiple digital circuits 310 is less than that drawn by, for example, DSP 110 in FIG. 1. Since the currents are distributed across the output clock period, the peak amplitude of the current is reduced and AC current variations are also reduced.

Accordingly, by dividing input clock signal 122 into multiple phases, the peak current load is reduced, and the phase-shifted current loads sum to produce a smoother current waveform. In other words, the supply current $i_2(t)$ 306 has reduced peak-to-peak variation when digital circuits 310 are configured to process data in multiple different phases.

Figure 4:
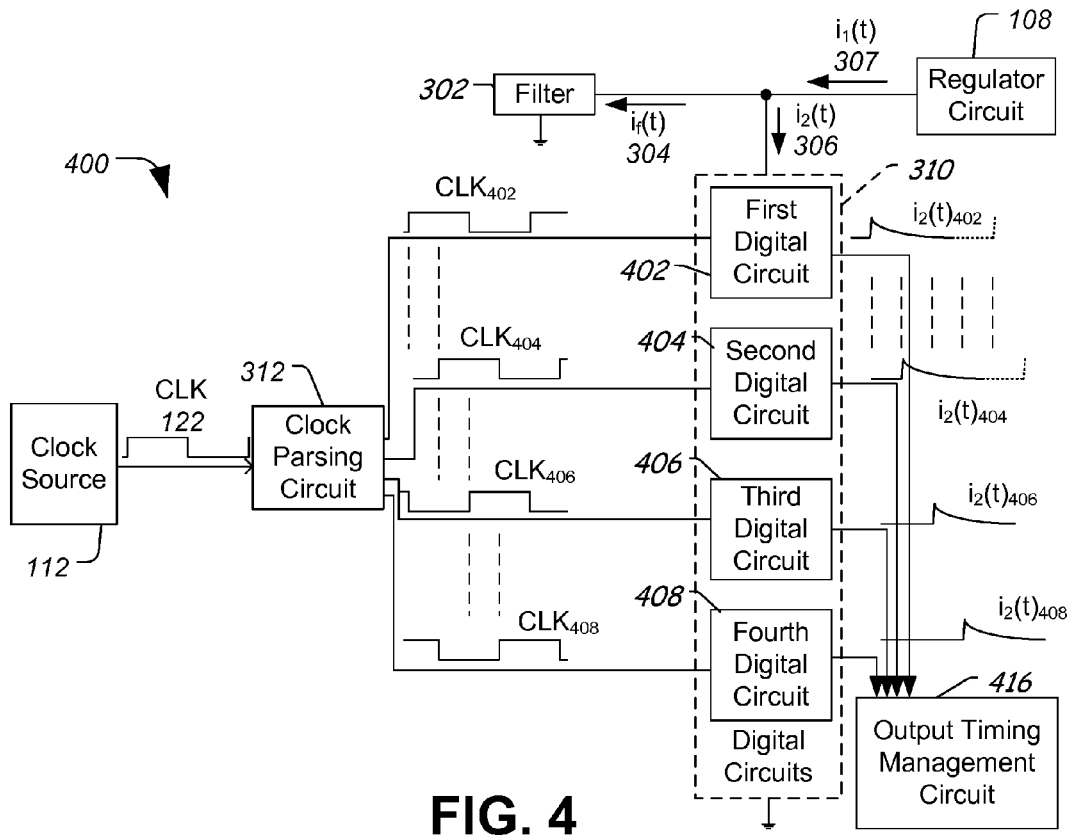
FIG. 4 is a block diagram of an embodiment of the circuit of FIG. 3 illustrating the multiple digital circuits, the multiple clock signals having different phases, and the corresponding currents drawn by the multiple digital circuits.

FIG. 4 is a block diagram of an embodiment 400 of the circuit 300 of FIG. 3 illustrating digital circuits 310 including multiple digital circuits 402, 404, 406, and 408, the multiple clock signals ($CLK_{402}$, $CLK_{404}$, $CLK_{406}$, and $CLK_{408}$) having different phases, and the corresponding currents ($i_2(t)_{402}$, $i_2(t)_{404}$, $i_2(t)_{406}$, and $i_2(t)_{408}$) drawn by the multiple digital circuits.

In the illustrated embodiment, clock source 112 provides input clock signal 122 to clock parsing circuit 312, which produces four clock signals having different phases. Clock parsing circuit 312 clocks first digital circuit 402 using a first clock signal ($CLK_{402}$), second digital circuit 404 using a second clock signal ($CLK_{404}$), third digital circuit 406 using a third clock signal ($CLK_{406}$), and fourth digital circuit 408 using a fourth clock signal ($CLK_{408}$). Digital circuits 402, 404, 406, and 408 receive data and process the data in response to the respective clock signals. In the illustrated embodiment, the digital circuits 402, 404, 406, and 408 are within different clock domains of a digital circuit, such as a DSP having multiple clock domains.

In response to first clock signal $CLK_{402}$, first digital circuit 402 draws a first current ($I_2(t)_{402}$) from regulated power supply ($V_{dd}$) 328 to process first data according to a phase associated with first clock signal $CLK_{402}$ to produce a first data output. Second digital circuit 404 draws a second current ($I_2(t)_{404}$) from regulated power supply ($V_{dd}$) 328 to process second data according to a phase associated with second clock signal $CLK_{404}$ to produce a second data output. Third digital circuit 406 draws a third current ($I_2(t)_{406}$) from regulated power supply ($V_{dd}$) 328 to process third data according to a phase associated with third clock signal $CLK_{406}$ to produce a third data output. Fourth digital circuit 408 draws a fourth current ($I_2(t)_{408}$) from regulated power supply ($V_{dd}$) 328 to process fourth data according to a phase associated with fourth clock signal $CLK_{408}$ to produce a fourth data output. Each of the data outputs are provided to an output timing management circuit 416.

In one embodiment, output timing management circuit 416 receives each of the data outputs and synchronizes the data outputs to a common clock signal, such as input clock signal 122, one of the multiple output clock signals, or another clock signal. Once synchronized, the data outputs may be provided to destination circuits. Such destination circuits can include other digital circuits. For example, data from digital circuit 402 can be synchronized and provided to digital circuit 404.

In another embodiment, during layout and design processes, consideration is given to the timing constraints associated with each of the digital circuits 402, 404, 406, and 408, which are arranged to account for the time for data to shift from one of digital circuits to another to avoid timing violations. In this embodiment, output timing management circuit 416 may be omitted, and timing considerations are accounted for by design. In such an implementation having four clock phases, digital circuits 402, 404, 406, and 408 designed and interconnected to provide adequate time for data to shift, for example, from first digital circuit 402 to a destination circuit without timing violations. In one instance, the destination circuit could be second digital circuit 404. In one particular example, such timing may be controlled to provide a maximum time for such data transfers, such that the data has ¾ths of the clock cycle to be communicated from one digital circuit to another, leaving time for the data signal to stabilize before the transferred data is processed. Such layout and design considerations are known in the processor art for ensuring proper timing between discrete processing units, such as adders and arithmetic logic units. In this instance, such considerations are adjusted to account for larger timing variations from the phase offsets than are ordinarily associated with parasitic delays.

In still another embodiment, output timing management circuit 416 is a control circuit provided to dynamically manage data flow (as the data becomes available). Output timing management circuit 416 controls routing of output data between digital circuits 402, 404, 406, and 408 and between the digital circuits and destination circuits. Though output timing management circuit 416 is depicted as a discrete component that is separate from digital circuits 402, 404, 406, and 408, in an alternative embodiment, one of the digital circuits, such as digital circuit 402 can operate as the output timing management circuit 416 to manage data flow between the other digital circuits 404, 406, and 408.

In an embodiment, output timing management circuit 416 may include a clock divider to produce a clock signal having a frequency sufficient to sample the state of each of the digital circuits 402, 404, 406, and 408 one or more times per clock period. In a particular example, the rate may be more than two times the number of different clock phases, ensuring that the state of each digital circuit is sampled at least twice per clock period.

In yet another implementation, output timing management circuit 416 may represent an intermediate clock domain, and output timing management circuit 416 has relaxed input constraints to receive each of the data outputs signals without timing violations. For example, output timing management circuit 416 may be clocked using the first clock signal 122, one of the divided clocks, or another clock. Thus, the intermediate clock domain differs from at least some of the clock domains of digital circuits 310. In this example, output timing management circuit 416 receives each of the respective data outputs and clocks them into the intermediate clock domain. This intermediate clock domain can have relaxed constraints on its input and can be configured to facilitate data transfers between clock domains.

Regardless of how the phase offsets of the digital outputs are reconciled, it should be understood that any number of phases can be used. Each additional phase may add to the complexity of the synchronization and/or to the complexity of the timing control. However, such timing constraints can be adjusted to fit the particular configuration so that any number of phases can be used. Further, each additional phase operates to further distribute the peak instantaneous current draw, providing a reduced power supply voltage disturbance that would otherwise be produced using a common clock.

Figure 5:
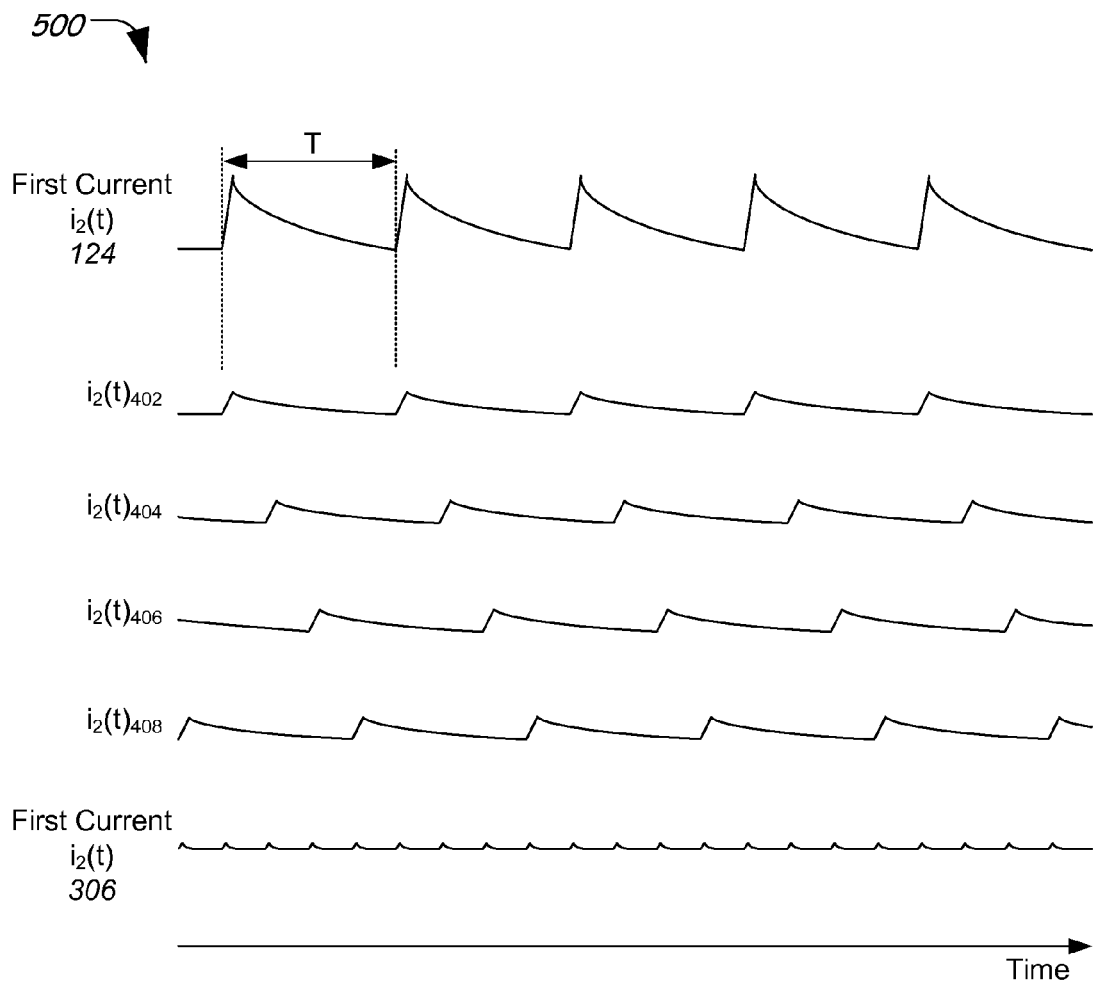
FIG. 5 is a timing diagram of illustrating a representative example of total current drawn by the integrated circuit of FIG. 1 as compared to the individual currents and the total current drawn by the circuit of FIG. 4.

FIG. 5 is a timing diagram 500 of illustrating a representative example of current $i_2(t)$ 124 drawn by the integrated circuit 100 of FIG. 1 as compared to the individual currents ($i_2(t)_{402, 404, 406, and 408}$) and the total current $i_2(t)$ 306 drawn by the circuit 400 of FIG. 4. As previously discussed with respect to FIGS. 1 and 2, the current $i_2(t)$ 124 rises, peaks, and then decreases within each clock period (T) of input clock signal 122 and some of the energy from such peak-to-peak variations can produce radiated spectral energy at the clock frequency and its harmonics.

The individual currents $I_2(t)_{402, 404, 406 and 408}$ drawn by digital circuits 402, 404, 406 and 408 have smaller peak amplitudes as compared to current $i_2(t)$ 124 in circuit 100 depicted in FIG. 1. Further, since the peaks of the individual currents $I_2(t)_{402, 404, 406 and 408}$ are phase-shifted relative to input clock signal 122, the sum of the individual currents provides a more consistent current load relative to current $i_2(t)$ 124. Accordingly, the current $i_1(t)$ 307 at pin 104 is relatively constant as compared to the current $i_1(t)$ 107 depicted in FIG. 1. The smoother waveform represented by current $i_2(t)$ 306 can be readily filtered using on-chip capacitors. Further, the smoother waveform, $i_1(t)$ 307 radiates less spectral energy than the waveform represented by current $i_1(t)$ 107 depicted in FIGS. 1 and 2.

Figure 6:
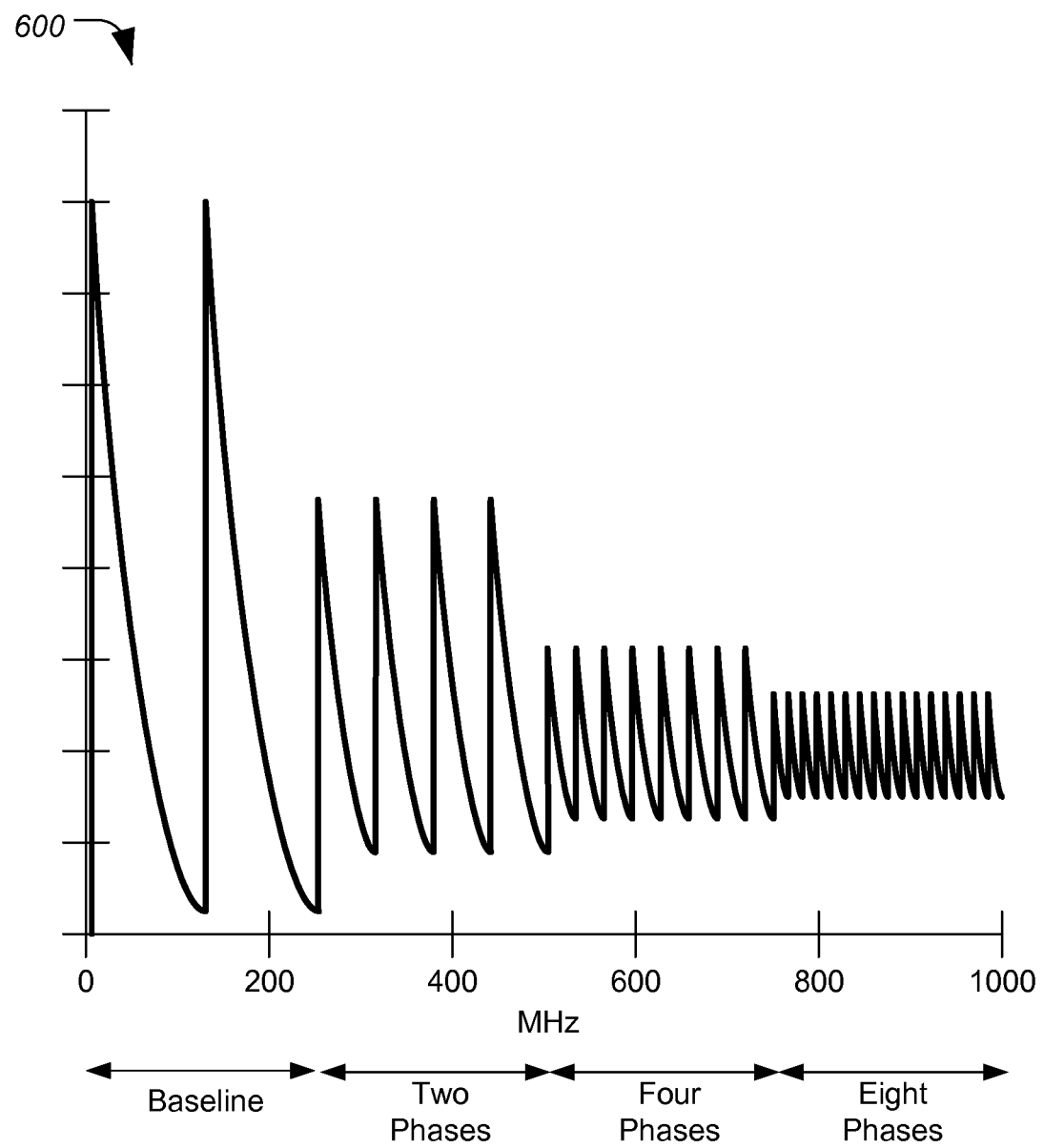
FIG. 6 is a diagram of current amplitude versus frequency illustrating current profiles of the digital circuitry as a function of the number of phases for a given DC current.

FIG. 6 is a diagram 600 of current amplitude in milliamps versus frequency in megahertz illustrating current profiles of integrated circuit 300 depicted in FIG. 3 as a function of the number of phases for a given DC current. In diagram 600, the clock signal has a frequency of approximately 140 MHz. As shown, the AC current amplitude is reduced by almost one half when it is divided into two phases. In the two-phase implementation, each current component carries half of the current, since only half of the circuit is driven by each clock phase. As the number of phases is increased to four and then eight, each phase drives a portion of the circuit, and the AC current amplitude is reduced further.

Unfortunately, each additional phase adds complexity for the circuit designer to manage the different clock phases. In particular, each additional phase adds design and layout complexity to synchronization circuit 316. At some number of phases, the amount of AC current reduction may not justify the increased design complexity. However, any number of phases may be used to distribute the current load, depending on the implementation.

Diagrams 500 and 600 in FIGS. 5 and 6 demonstrate that driving digital circuits using clock signals having different phases can improve transient current variations in the supply current. One of ordinary skill in the art will recognize that reducing such current variations improves frequency management in a radio frequency system. It is well known in mixed-signal systems that analysis of digital spectral energy is important and that ensuring that digital energy does not show up in the received signal frequency range is advantageous. Using multiple clock phases to clock the digital circuits reduces peak current transients and moves the remaining digital spectral content substantially higher in frequency where it is more easily filtered on chip.

For example, in a system where the digital clock is at approximately 100 MHz that uses four phase clocking, the digital energy appears at frequencies of approximately 400 MHz and above. Thus, the received signal bands in lower frequencies that are multiples of 100 MHz will experience less electromagnetic interference from current variations in the input power supply. With four phases of a 100 MHZ clock, interference may appear at a frequency of 400 MHz and at its harmonics.

In some instances, the different clock phases will not be matched perfectly in terms of current consumption. Some of the digital circuits may draw more current than others. In such a case, there will be residual energy at multiples of the clock frequency. However, the AC current reduction is still substantial, as a thirty percent (30%) match in current draw between output clock phases will still improve harmonics by nearly 10 dB.

In some instances, regulator circuit 108 may be configured to maintain a substantially constant current, such as current ($i_1(t)$ 107) from pin 104 of circuit 100 depicted in FIG. 1. In such an instance, regulator circuit 108 may be designed to isolate digital circuits 310 from pin 104 such that changes in current drawn by digital circuits 310 do not appear at pin 104. However, if the increased current does not come from pin 104 (i.e., from external power supply 102), the current drawn by digital circuits 310 must come from an on-chip source, at least until the low bandwidth of regulator circuit 108 allows the current at pin 104 to reach a level sufficient to satisfy the increased current draw. However, on-chip sources of large current are often not practical. Accordingly, digital circuits 310 can cause the power supply voltage ($V_{dd}(t)$) 128 to drop by drawing more current. Such power supply voltage drops can be particularly severe where the clock source 112 or when the input clock signal 122 to the digital circuit turns on and off, for example, to conserve power. Accordingly, it may be desirable to modify circuit 300 to include a startup circuit to manage state transitions (such as from a power conservation state to a fully operational state) for digital circuits 310.

Figure 7:
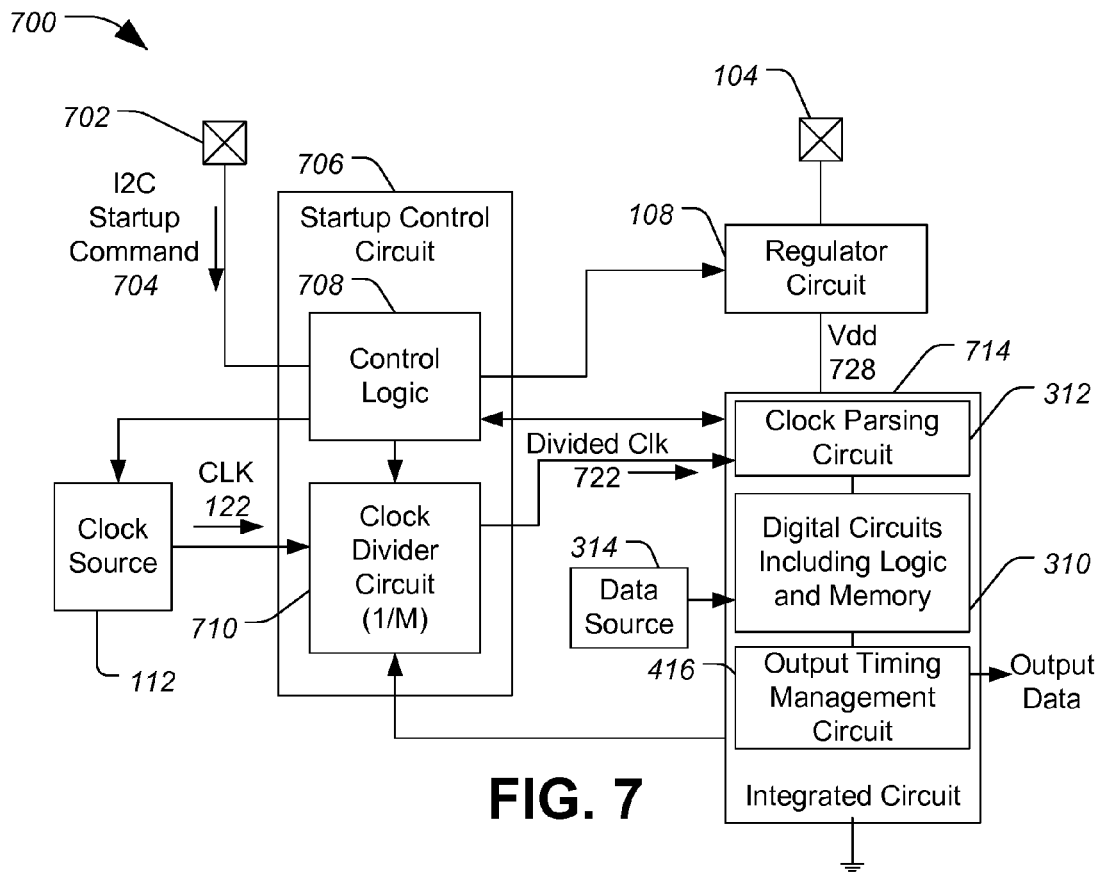
FIG. 7 is a block diagram of an embodiment of a circuit including the clock parsing circuit of FIG. 3 and including a startup control circuit configured to alter a clock signal during a startup process.

FIG. 7 is a block diagram of an embodiment of a circuit 700 including the clock parsing circuit 312 of FIG. 3 and including a startup control circuit 706 configured to alter a clock signal during a startup process. Startup control circuit 706 includes control logic 708 connected to pin 702 to receive a startup command 704, such as an inter-integrated circuit (I²C) startup command, and includes a clock divider circuit (1/M) 710. Startup control circuit 706 is connected to clock source 112, regulator circuit 108, circuit 714, and clock divider circuit 710. In the illustrated embodiment, circuit 714 includes clock parsing circuit 310, digital circuits 310 including logic and memory, and output timing management circuit 416.

When regulator circuit 108 is configured to maintain a relatively constant current at pin 104, the startup control circuit 706 can be used to transition the current load slowly from low power to full operation and vice versa. Control logic 708 monitors operation of digital circuits 310 to determine their operating states. When the operating state transitions from an idle state to a full operation state or vice versa, control logic 708 controls clock source 112 and clock divider circuit (1/M) 710 to provide a divided clock signal 722 to clock parsing circuit 312. Divided clock signal 722 can have a variable clock period to control the rate at which circuit 714 transitions between states (or at which digital circuits 310 transition between states). In an example, control logic 708 can control the variable (M) within clock divider circuit to adjust the period of divided clock signal 722.

By adjusting the clock period of divided clock signal 722 over time, the state transition of each of the digital circuits 310 can be controlled to incrementally change the current load over time, providing time for regulator circuit 108 to supply the steady state load from external power source 102 (depicted in FIG. 1), which is connected to pin 104. Thus, by controlling input clock signal 122 (i.e., by providing a divided clock signal 722) during a startup process, small changes in current load can be managed incrementally without generating current spikes that interfere with nearby circuitry. In an alternative embodiment, portions of circuit 714 can be turned on at different times, providing a similar effect.

In the illustrated embodiment, clock parsing circuit 312 is responsive to control logic 708 to selectively parse the divided clock signal 722. When it is not parsing the divided clock signal 722, clock parsing circuit 312 can operate as a multiplexer to drive digital circuits 310 using divided clock signal 722. In another embodiment, the clock parsing circuit 312 can generate multiple clock signals having different phases based on the divided clock signal 722 to clock the circuits at different phases, as discussed above with respect to FIGS. 3-6, further smoothing the current drawn by digital circuits 310 during a startup process or a state transition process (such as from a power-conservation state to a fully operational state).

Figure 8:
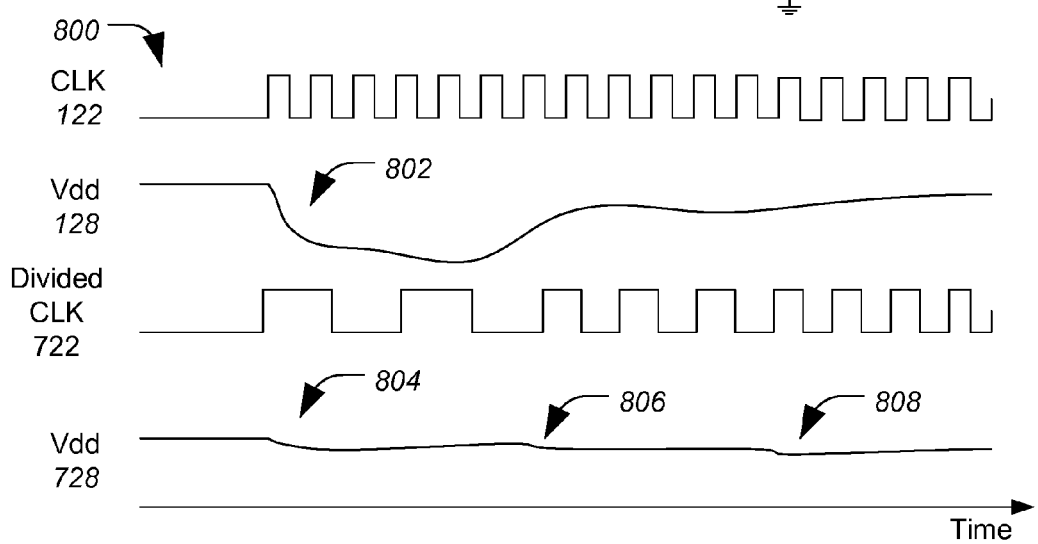
FIG. 8 is a timing diagram of a representative embodiment of the clock signals and regulated voltage supplies of the circuits of FIG. 1 and FIG. 7 during a startup operation.

FIG. 8 is a timing diagram 800 of a representative embodiment of input clock signal 122 and 722 and regulated voltage supplies $V_{dd}(t)$ 128 and 728 of the circuits of FIG. 1 and FIG. 7 during a startup operation. Input clock signal 122 has a substantially constant clock period. When DSP 110 is turned on, the increased current drawn by DSP 110 pulls down the supply voltage $V_{dd}(t)$ 128, as indicated at 802. Such a drop or droop in the supply voltage $V_{dd}(t)$ 128 can adversely impact the performance of DSP 110.

Divided clock signal 722 has a clock period that varies over time. Since the divided clock signal 722 varies, digital circuits 310 transition between states slowly. When the clock period changes, regulated supply voltage $V_{dd}$ 728 experiences less of a voltage drop. Changes in the clock frequency of divided clock signal 722 may introduce small ripples in the supply voltage $V_{dd}$ 728, as indicated at 804, 806, and 808. Overall, the instantaneous drop in the supply voltage $V_{dd}$ 728 due to changes in current drawn by digital circuits 310 can be reduced significantly. By controlling timing of digital circuits 310 based on the multiple phases of the output clock signals, regulator 108 can supply the changes to the steady state load incrementally.

In conjunction with the circuits and method described above with respect to FIGS. 1-8, a circuit is disclosed that is configured to clock digital circuitry in multiple phases, causing the digital circuitry to draw current from the regulated power supply at different times within a clock period. Digital circuitry operates on data according to the multiple phases, drawing current according to the multiple phases. Further, an output timing management circuit is disclosed that can resynchronize the output data, re-clock the output data to an intermediate clock domain, or control routing of the output data to prevent timing violations at destination circuits.

By distributing the current across the clock period, the instantaneous current draw is reduced and the current variations are distributed throughout the output clock period, reducing current variations at an input pin of the circuit and thereby reducing radiated spectral energy. Further, by dividing the clock signal into multiple phases (i.e., by generating multiple clock signals having different phases), the spectral components of the current variations are shifted to higher frequencies (i.e., at frequencies that are multiples of the number of phases), thereby reducing electromagnetic interference at the frequency of the input clock signal. Additionally, in some embodiments, a startup circuit is included to adjust the clock period over time to incrementally affect the total current draw.

Although the present invention has been described with reference to preferred embodiments, workers skilled in the art will recognize that changes may be made in form and detail without departing from the scope of the invention.

What is claimed is:

1. A circuit comprising:
   a power supply terminal;
   a clock parsing circuit configured to produce multiple clock signals having different phases;
   a plurality of digital circuits coupled to the clock parsing circuit and the power supply terminal, each digital circuit including an input to receive data and logic to process the data, each digital circuit responsive to a phase associated with a respective clock signal of the multiple clock signals to draw current from the power supply terminal to process the data to produce a data output;
   a control circuit coupled to the clock parsing circuit and the plurality of digital circuits, the control circuit to selectively control the clock parsing circuit to provide a clock signal of the multiple clock signals having a clock period that differs from that of others of the multiple clock signals; and
   an output timing management circuit coupled to each of the plurality of digital circuits and configured to control data outputs of each of plurality of digital circuits provided to one or more destination circuits, the output management timing circuit including an intermediate clock domain circuit having relaxed input timing constraints and configured to re-clock each of the digital outputs to an intermediate clock frequency.

2. The circuit of claim 1, further comprising:
   a power supply pin; and
   a regulator circuit coupled to the power supply pin and configured to receive a power supply current from the power supply pin, the regulator circuit to provide a regulated power supply voltage to the power supply terminal.

3. The circuit of claim 2, wherein each of the plurality of digital circuits draw a substantially similar total current from the regulated power supply terminal in response to a transition of the respective clock signal.

4. The circuit of claim 3, wherein a total instantaneous current drawn by the plurality of digital circuits is substantially constant over the common clock period.

5. The circuit of claim 1, wherein the multiple clock signals comprise an even number of clock signals having a respective number of unique phases within the common clock period.

6. The circuit of claim 1, wherein the output management timing circuit comprises the control circuit configured to control data transfers between each of the plurality of digital circuits and a respective one of the destination circuits.

7. The circuit of claim 1, wherein at least some of the multiple digital circuits to receive the data from a different data source than others of the multiple digital circuits.

8. The circuit of claim 1, wherein the output timing management circuit comprises a synchronization circuit coupled to each of the plurality of digital circuits and configured to receive an input clock signal, the synchronization circuit configurable to synchronize the data output from each of the multiple digital circuits to the input clock signal to produce a synchronized data output.

9. The circuit of claim 1, wherein the control circuit controls the clock parsing circuit to vary the clock period to control the rate at which at least one of the plurality of digital circuits transitions between states.

10. The circuit of claim 1, wherein the control circuit monitors operating states of the plurality of digital circuits and selectively controls the clock parsing circuit to vary the clock rate when at least one of the plurality of digital circuits transitions between a first state and a second state to incrementally change a current load over time.

11. A method comprising:
   receiving an input clock signal having a clock period at a clock parsing circuit;
   generating multiple phase-shifted output clock signals based on the input clock signal using the clock parsing circuit, at least some of the multiple phase-shifted output clock signals having a respective phase offset within an output clock period, at least one of the multiple phase-shifted output clock signals having a clock period that is different from the clock period of the input clock signal; and
   providing the multiple phase-shifted output clock signals to a plurality of digital circuits to drive the plurality of digital circuits in multiple phases, each digital circuit including a data input to receive data;
   processing at least a portion of the data at each digital circuit using a unique one of the multiple phase-shifted clock signals to produce a respective data output;
   managing each of the respective data outputs of each of the plurality of digital circuits provided to one or more destination circuits using an output timing management circuit comprising an intermediate clock domain by re-clocking each of the respective data outputs to the intermediate clock domain using the output timing management circuit
   monitoring the plurality of digital circuits to detect a transition from an idle state to an on state of at least one of the plurality of digital circuits;
   dividing the input clock signal to produce an altered output clock signal having an altered output clock period; and
   providing the altered output clock signal to the clock parsing circuit.

12. The method of claim 11, wherein generating the multiple phase-shifted output clock signals comprises:
    generating an even number of phase-shifted output clock signals.

13. The method of claim 11, wherein each of the multiple phase-shifted output clock signals has unique phase relative to other phase-shifted output clock signals of the multiple phase-shifted output clock signals.

14. The method of claim 11, wherein providing the multiple phase-shifted output clock signals to the plurality of digital circuits comprises:
    driving a first circuit using a first phase-shifted output clock signal of the multiple phase-shifted output clock signals to process first data to produce first output data; and
    driving a second circuit using a second phase-shifted output clock signal of the multiple phase-shifted output clock signals to process second data to produce second output data; and
    wherein managing each of the respective data outputs comprises:
    synchronizing the first output data and the second output data to the input clock signal using the output timing management circuit.

15. The method of claim 11, wherein the output timing management circuit comprises a control circuit, and wherein managing each of the respective data outputs comprises:
    controlling data transfers between each of the plurality of digital circuits and a respective one of the one or more destination circuits using the control circuit.

16. The method of claim 11, wherein at least one of the plurality of digital circuits receives the data from a different data source than others of the plurality of digital circuits.

17. A circuit comprising:
    a clock input configured to receive an input clock signal having an input clock period;
    multiple digital circuits, each of the multiple digital circuits including an input to receive data and logic to process the data to produce output data;
    a clock parsing circuit coupled to the clock input and configurable to generate multiple phase-shifted output clock signals based on the input clock signal, at least some of the multiple phase-shifted output clock signals having a respective phase offset within an output clock period, the clock parsing circuit configured to selectively vary a clock period of at least one of the multiple phase-shifted output clock signals to be different from the input clock period, the clock parsing circuit to drive the multiple digital circuits in multiple phases based on at least one of the multiple phase shifted output clock signals and the at least one clock signal to process the data in multiple phases;
    an output timing management circuit coupled to each of the plurality of digital circuits and configured to control data outputs of each of plurality of digital circuits provided to one or more destination circuits; and
    a synchronization circuit coupled to each of the multiple digital circuits and configured to receive the input clock signal, the synchronization circuit configurable to synchronize the output data from each of the multiple digital circuits to the input clock signal to produce a synchronized data output.

18. The circuit of claim 17, wherein the clock parsing circuit is configured to divide the output clock period into a plurality of sub-intervals, wherein each of the multiple phase-shifted output clock signals is aligned to a unique one of the plurality of sub-intervals.

19. The circuit of claim 17, wherein the output timing management circuit comprises:
    a control circuit coupled to each of the multiple digital circuits and configured to manage routing of the output data from each of the multiple digital circuits to a respective one of the one or more destination circuits.

20. The circuit of claim 19, further comprising:
    a power supply terminal; and
    a voltage regulator circuit configured to provide a substantially constant power supply voltage to the power supply terminal;
    wherein each of the multiple digital circuits is coupled to the power supply terminal; and
    wherein timing of current drawn by the multiple digital circuits in response to the multiple phase-shifted output clock signals is distributed across the output clock period.

21. The circuit of claim 17, wherein the output timing management circuit has a an intermediate clock domain and has relaxed input constraints, the output timing management circuit is configured to re-clock the output data from each of the multiple digital circuits to the intermediate clock domain.

22. The circuit of claim 21, further comprising:
    a filter circuit coupled to the power supply terminal to filter AC current variations.

23. The circuit of claim 17, further comprising:
    a startup circuit configured to control the clock parsing circuit to adjust a period of at least one of the multiple phase-shifted output clock signals during a state transition associated with the multiple digital circuits to control a rate of the state transition of one or more of the multiple digital circuits.

24. The circuit of claim 17, wherein the multiple digital circuits comprise different clock domains within a digital signal processor.

25. The circuit of claim 17, wherein at least some of the multiple digital circuits to receive the data from a different data source than others of the multiple digital circuits.

* * * * *